United States Patent
Naito et al.

(10) Patent No.: US 7,247,031 B2
(45) Date of Patent: *Jul. 24, 2007

(54) ELECTRIC JUNCTION BOX AND ITS ASSEMBLING PROCESS

(75) Inventors: Tsutomu Naito, Yokkaichi (JP); Tatsuya Oka, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/560,587

(22) PCT Filed: May 31, 2004

(86) PCT No.: PCT/JP2004/007499

§ 371 (c)(1),
(2), (4) Date: Dec. 13, 2005

(87) PCT Pub. No.: WO2004/112210

PCT Pub. Date: Dec. 23, 2004

(65) Prior Publication Data

US 2006/0141820 A1 Jun. 29, 2006

(30) Foreign Application Priority Data

Jun. 13, 2003 (JP) .............................. 2003-170046

(51) Int. Cl.
*H01R 12/00* (2006.01)
(52) U.S. Cl. .................. 439/75; 439/76.2; 439/949
(58) Field of Classification Search .................. 439/74, 439/75, 76.2, 751, 943, 949

See application file for complete search history.

(56) References Cited

U.S. PATENT DOCUMENTS

| 4,781,621 | A | * | 11/1988 | Sugiyama et al. | .......... 439/559 |
| 5,823,819 | A | * | 10/1998 | Kondo et al. | ................ 439/487 |
| 6,503,090 | B2 | * | 1/2003 | Onizuka | ....................... 439/75 |
| 6,761,567 | B2 | * | 7/2004 | Onizuka et al. | ........... 439/76.2 |
| 7,101,197 | B2 | * | 9/2006 | Naito et al. | .................... 439/75 |
| 2002/0001983 | A1 | * | 1/2002 | Torii | ......................... 439/76.2 |

FOREIGN PATENT DOCUMENTS

| JP | A 7-297562 | 11/1995 |
| JP | A 2002-369340 | 12/2002 |
| JP | A 2003-87936 | 3/2003 |

* cited by examiner

*Primary Examiner*—Tho D. Ta
(74) *Attorney, Agent, or Firm*—Oliff & Berridge, PLC

(57) ABSTRACT

Printed boards are arranged vertically such that the outer circumferential part of an upper printed board projects outward beyond the outer circumferential part of a lower printed board, and the projected outer circumferential part is contained in a printed board holding case while being arranged on the horizontal step part thereof. The press fit electric contact part at the second vertical part of a press fit terminal is brought into press fit contact with a conductor terminal hole at the circumferential edge of the lower printed board. On the other hand, the first vertical part is extended along the vertical outer surface of the printed board holding case and a press fit electric contact part is brought into press fit contact with a conductor terminal hole at the circumferential edge of the upper printed board. The horizontal part of the press fit terminal is extended along the lower surface at the horizontal step part of the printed board holding case and supported from below by a supporting part projecting from a lower case.

6 Claims, 13 Drawing Sheets

[Prior Art]

ELECTRIC JUNCTION BOX AND ITS ASSEMBLING PROCESS

TECHNICAL FIELD

The present invention relates to an electric junction box and a method of assembling the electric junction box. More particularly in the present invention, electric conductors of a plurality of printed boards accommodated inside the electric junction box are electrically connected to each other.

In recent years, with an increase of electric component parts to be mounted on vehicles, printed boards are used as circuit component parts constituting circuits inside the electric junction box.

BACKGROUND ART

As shown in FIG. 13, the electric junction box 1 proposed in Japanese Patent Application Laid-Open No. 7-297562 accommodates the first printed board 5 and the second printed board 6 inside the box composed of the upper case 2 and the lower case 3, with the insulating sheet 4 interposed between the upper case 2 and the lower case 3. Terminal holes 5a and 6a are formed on the first printed board 5 and the second printed board 6 respectively. Connection pins 7 are inserted through the terminal holes 5a and 6a and soldered thereto to accomplish electrical connection.

Patent document 1: Japanese Patent Application Laid-Open No. 7-297562

DISCLOSURE OF THE INVENTION

Problems to be Solved by the Invention

However, in the electric junction box 1, by merely inserting the connection pins 7 connecting the electric conductor of the first printed board 5 and that of the second printed board 6 with each other through the terminal holes 5a and 6a, the connection pins 7 are not fixed to the terminal holes 5a and 6a. Thus it is necessary to solder the connection pins 7 to the first and second printed boards 5, 6. Hence the electric junction box 1 has a problem that assembling operability is not good. The electric junction box 1 has another problem that because the connection pins 7 are soldered to the first printed board 5 and the second printed board 6, the construction of the electrical connection circuit connecting the first printed board 5 and the second printed board 6 with each other cannot be easily altered.

The present invention has been made in view of the above-described problem. Therefore it is an object of the present invention to eliminate a soldering work by using a press fit terminal in electrically connecting electric conductors of printed boards to each other and connect the electric conductors easily by using the press fit terminal.

Means for Solving the Problems

To solve the above-described problem, the present invention provides an electric junction box in which a plurality of printed boards stepwise disposed is accommodated inside an upper case and a printed board holding case, with the printed boards spaced at intervals; a periphery of an upper-position printed board is projected beyond a periphery of a lower-position printed board; electric conductors are arranged side by side on a peripheral portion projected from the lower-position printed board; and terminal holes each having a conductive layer, connected with one of the electric conductors, formed on an inner peripheral surface thereof are arranged side by side on the peripheral portion projected from the lower-position printed board, a peripheral wall of the printed board holding case is formed stepwise in conformity to a stepwise disposition of a plurality of the printed boards; and insertion through-holes through which press fit terminals are inserted respectively are formed side by side on each horizontal stepped part;

each of the press fit terminals is formed by bending a rod-shaped material made of conductive metal and has a long first vertical part, a horizontal part bent at a lower end of the first vertical part, and a short second vertical part bent upward at a leading end of the horizontal part; and a plurality of the press fit terminals is disposed along the peripheries of the printed boards; the horizontal parts of the press fit terminals are disposed along a lower surface of each of the horizontal stepped parts of the printed board holding case, and the second vertical part of each of the press fit terminals is inserted through an insertion through-hole of each of the horizontal stepped parts and pressed into each of the terminal holes of the lower-position printed boards to thereby electrically bring the second vertical part into contact with the conductive layer; and the first vertical part of each of the press fit terminals is disposed along a vertical outer surface of a stepwise part of the printed board holding case, and an upper portion of the first vertical part is pressed into one of the terminal holes of the upper-position printed board to thereby electrically bring the first vertical part into contact with the conductive layer.

In the above-described construction, in the state where horizontal part of the press fit terminal is disposed along the lower surface of the horizontal stepped part of the printed board holding case and in the state where the first vertical part is disposed along the vertical outer surface of the stepwise part of the printed board holding case, the first vertical part is pressed into the terminal hole of the upper-position printed board, and the second vertical part is pressed into the terminal hole of the lower-position printed board. Therefore the press fit terminal can be fixed to the printed board in a stable state.

Further because the horizontal part of the press fit terminal and its first vertical part are disposed outside the printed board holding case, it is possible to enhance the heat dissipation performance of the press fit terminal.

The press fit electric contact parts of the first and second vertical parts of the press fit terminal are stricken in the widthwise direction thereof so that the press fit electric contact parts can be decreased in the diameter thereof. Therefore by merely pressing the press fit electric contact parts into the terminal holes of the printed boards respectively, the press fit terminal can be fixed to the printed boards. Thus it is unnecessary to solder the press fit terminal to the printed boards.

Further because the press fit electric contact part of the first vertical part and that of the second vertical part are formed at horizontally shifted positions, the press fit electric contact part of the first vertical part can be pressed into the terminal hole of the upper-position printed board without inserting the press fit electric contact part of the first vertical part into the terminal hole of the lower-position printed board. Thereby a work of pressing the press fit terminal into the terminal hole can be accomplished easily. Thus the electric conductors of the printed boards can be easily connected to each other by using the press fit terminal.

As described above, because the electric conductors of the printed boards can be easily connected to each other by using the press fit terminal, it is possible to accommodate a plurality of printed boards inside the electric junction box. Thereby the electric junction box is allowed to have a high density, be compact, and have a low cost.

The number of the printed boards is two or more; and electric conductors of adjacent upper and lower printed boards or electric conductors of upper and lower printed boards sandwiching an intermediately positioned printed board therebetween are connected to each other with the press fit terminals.

As described above, in the state where the horizontal part of the press fit terminal is disposed along the lower surface of the horizontal stepped part of the printed board holding case and in the state where the first vertical part is disposed along the vertical outer surface of the stepwise part of the printed board holding case, the first vertical part and the second vertical part are pressed into the terminal holes of the printed board respectively. Therefore the press fit terminal can be fixed to the upper and lower printed boards sandwiching the intermediately positioned printed board therebetween in a stable state. That is, the press fit terminal can be fixed to the upper and lower printed boards spaced at a long interval in a stable state. Further because the peripheral portion of the upper-position printed board is projected beyond that of the intermediately positioned printed board, the intermediately positioned printed board does not interfere with the first vertical part of the press fit terminal.

A lower case is placed on the printed board holding case in such a way that the lower case covers the printed board holding case. A supporting part supporting a horizontal stepped part of the printed board holding case from below is projected from the lower case. The supporting part supports a horizontal part of the press fit terminal disposed along a lower surface of the horizontal stepped part.

In the above-described construction, because the horizontal part of the press fit terminal is supported from below by the supporting part of the lower case, it is possible to securely prevent the press fit terminal from being removed from the printed board.

The present invention also provides a method of assembling the above-described electric junction box, comprising the steps of inserting a second vertical part of a press fit terminal into an insertion through-hole of a lower-position horizontal stepped part of a printed board holding case from a periphery of the printed board holding case; inserting a first vertical part of the press fit terminal into an insertion through-hole of an upper-position horizontal stepped part of the printed board holding case; accommodating a plurality of the printed boards inside the printed board holding case by supporting peripheral portions of the printed boards with the horizontal stepped parts of the printed board holding case; pressing the second vertical part of the press fit terminal into a terminal hole of a lower-position printed board; pressing an upper portion of the first vertical part into a terminal hole of an upper-position printed board; connecting electric conductors of the printed boards disposed by the press fit terminal; thereafter placing an upper case in which connector accommodation parts, fuse accommodation parts or/and relay accommodation parts are formed on the printed board holding case and connecting the upper case to the printed board holding case; and placing a lower case on the printed board holding case and connecting the lower case to the upper case.

In the above-described assembling method, a plurality of the printed boards is accommodated inside the printed board holding case by supporting the peripheral portions of the printed boards with the horizontal stepped parts of the printed board holding case. Thus the printed boards can be accommodated easily inside the printed board holding case.

The press fit terminal is inserted into the insertion through-hole of the printed board holding case, with the first vertical part of the press fit terminal disposed along the vertical outer surface of the stepwise part of the printed board holding case. Thus it is possible to facilitate an insertion work. Further the press fit terminal is pressed into the terminal hole until the horizontal part of the press fit terminal contacts the lower surface of the horizontal stepped part of the printed board holding case. Therefore the press fit terminal can be pressed into the terminal hole securely to a normal press fit position of the press fit terminal.

By placing the lower case on the printed board holding case in such a way that the lower case covers the printed board holding case, the horizontal part of the press fit terminal is sandwiched between the lower surface of the horizontal stepped part of the printed board holding case and the supporting part of the lower case. Therefore the press fit terminal can be reliably fixed to the printed boards. When the press fit terminal is not pressed into the normal press fit position, the press fit terminal is pressed upward by the supporting part of the lower case and pressed into the normal press fit position.

Effect of the Invention

As apparent from the foregoing description, according to the present invention, in the state where horizontal part of the press fit terminal is disposed along the lower surface of the horizontal stepped part of the printed board holding case and in the state where the first vertical part is disposed along the vertical outer surface of the stepwise part of the printed board holding case, the first vertical part is pressed into the terminal hole of the upper-position printed board, and the second vertical part is pressed into the terminal hole of the lower-position printed board. Therefore the press fit terminal can be fixed to the printed board in a stable state.

Further because the horizontal part of the press fit terminal and its first vertical part are disposed outside the printed board holding case, it is possible to enhance the heat dissipation performance of the press fit terminal.

Placing the lower case on the printed board holding case, projecting the supporting part supporting the horizontal stepped part of the printed board holding case from below from the lower case, and supporting the horizontal part of the press fit terminal disposed along the lower surface of the horizontal stepped part with the supporting part, it is possible to securely prevent the press fit terminal from being removed from the printed board.

Further because the press fit electric contact part of the first vertical part and that of the second vertical part are formed at horizontally shifted positions, the press fit electric contact part of the first vertical part can be pressed into the terminal hole of the upper-position printed board without inserting the press fit electric contact part of the first vertical part into the terminal hole of the lower-position printed board. Thereby a work of pressing the press fit terminal into the terminal hole can be accomplished easily. Thus the electric conductors of the printed boards can be easily connected to each other by using the press fit terminal.

In the above-described electric junction box, a plurality of the printed boards is accommodated inside the printed board holding case by supporting the peripheral portions of the printed boards with the horizontal stepped parts of the printed board holding case. Thus an assembling workability is fine because the printed boards can be accommodated easily inside the printed board holding case.

As described above, because the electric conductors of the printed boards can be easily connected to each other by using the press fit terminal, it is easy to assemble the electric junction box and accommodate a plurality of the printed boards inside the electric junction box. Thereby the electric junction box is allowed to have a high density, be compact, and have a low cost.

Explanation of Reference Numerals and Symbols

Figure 1A:
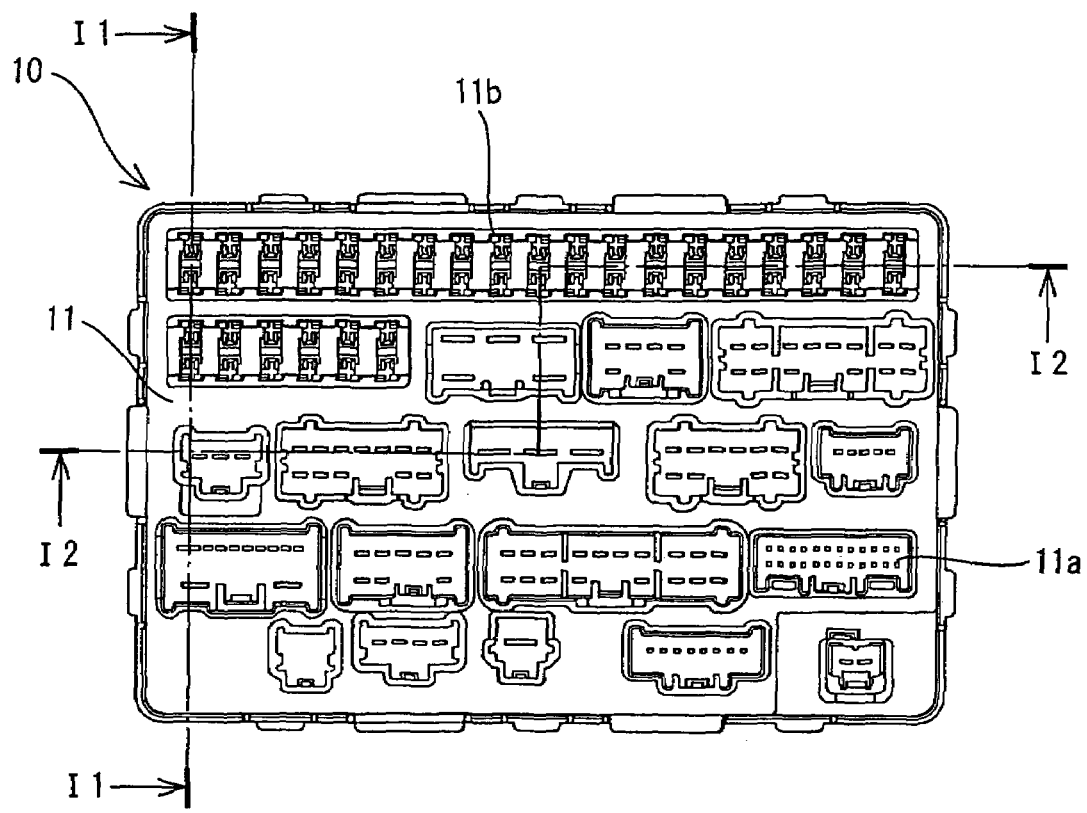
FIG. 1 shows an electric junction box of the present invention, in which (A) is a plan view and (B) is a bottom view.

10: electric junction box
11: upper case
11a: connector accommodation part at upper case side
12: printed board holding case
12a: vertical outer surface
12b: horizontal stepped part
13: lower case
13a: connector accommodation part at lower case side
13c: supporting part
14: first intermediate case
15: second intermediate case
16: insulating sheet
20: press fit terminal
21: first vertical part
22: horizontal part
23: second vertical part
24, 25: press fit portion
31: first printed board
31a, 32a, 33a: electric conductor
31b, 32b, 33b: terminal hole
31c: conductive layer
32: second printed board
33: third printed board
40: bus bar

BEST MODE FOR CARRYING OUT THE INVENTION

The embodiments of the present invention will be described below with reference to drawings.

FIGS. 1 through 9 show an embodiment of the present invention. In an electric junction box 10, an upper case 11 and a printed board holding case 12 are coupled to each other, and the lower case 13 is coupled to the printed board holding case 12 in such a way that the lower case 13 covers the printed board holding case 12.

As shown in FIG. 1(A), a plurality of connector accommodation parts 11a and a plurality of fuse accommodation parts 11b are provided on an upper surface of the upper case 11.

Figure 1B:
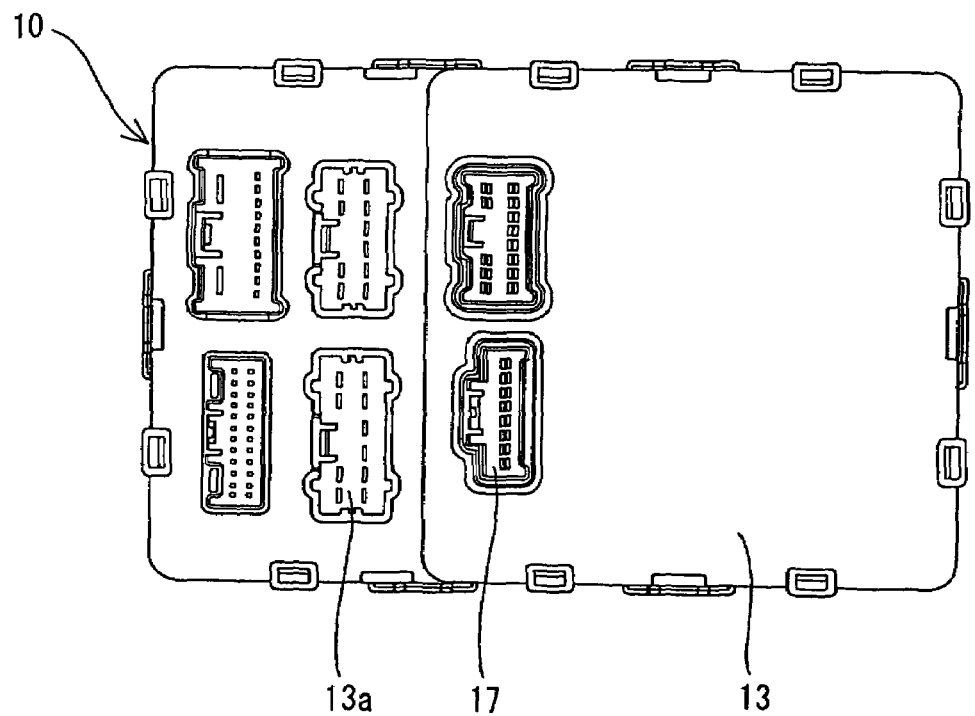
Figure 2:
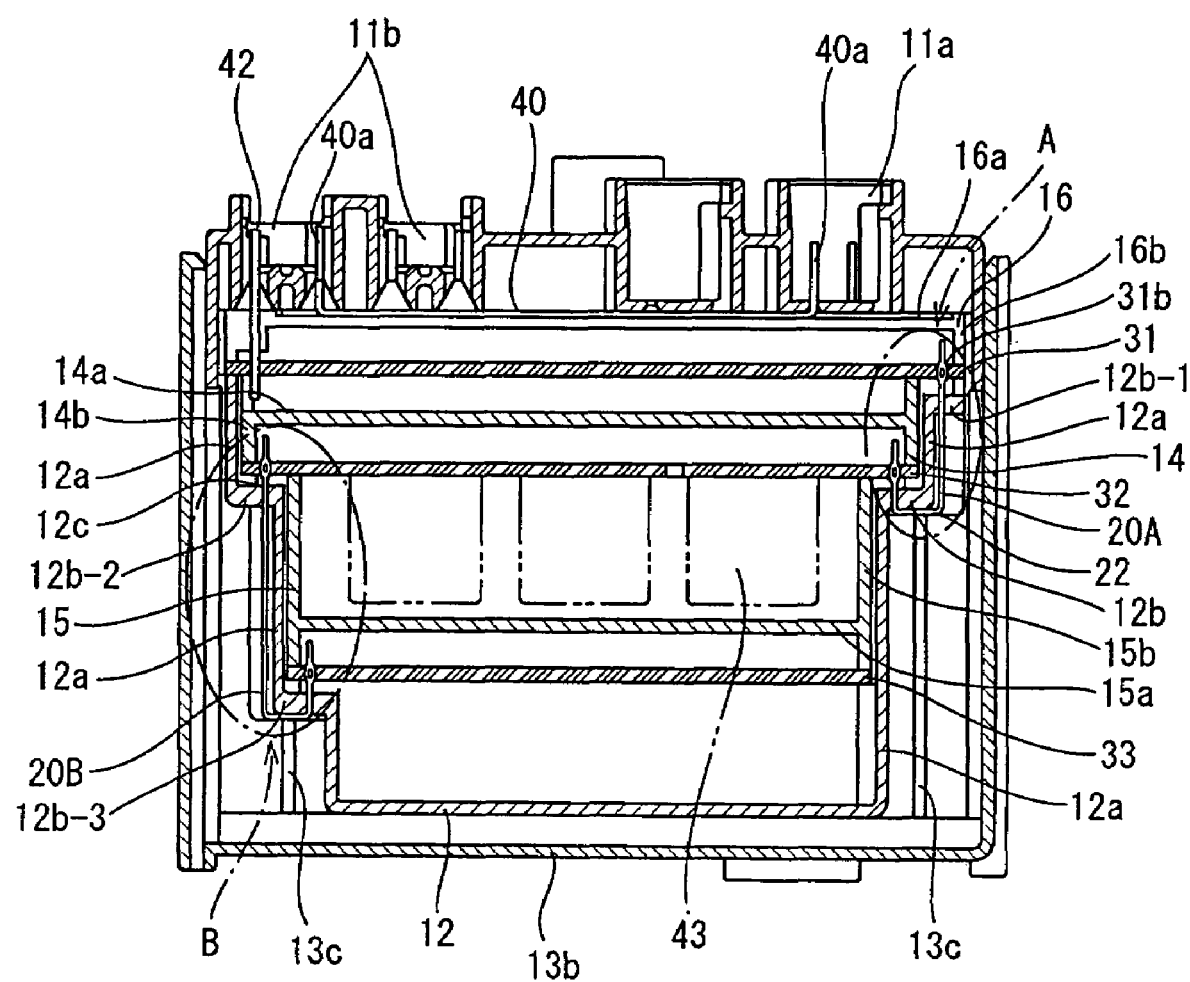
FIG. 2 is a sectional view of the electric junction box taken along a line I1–I1.
Figure 3:
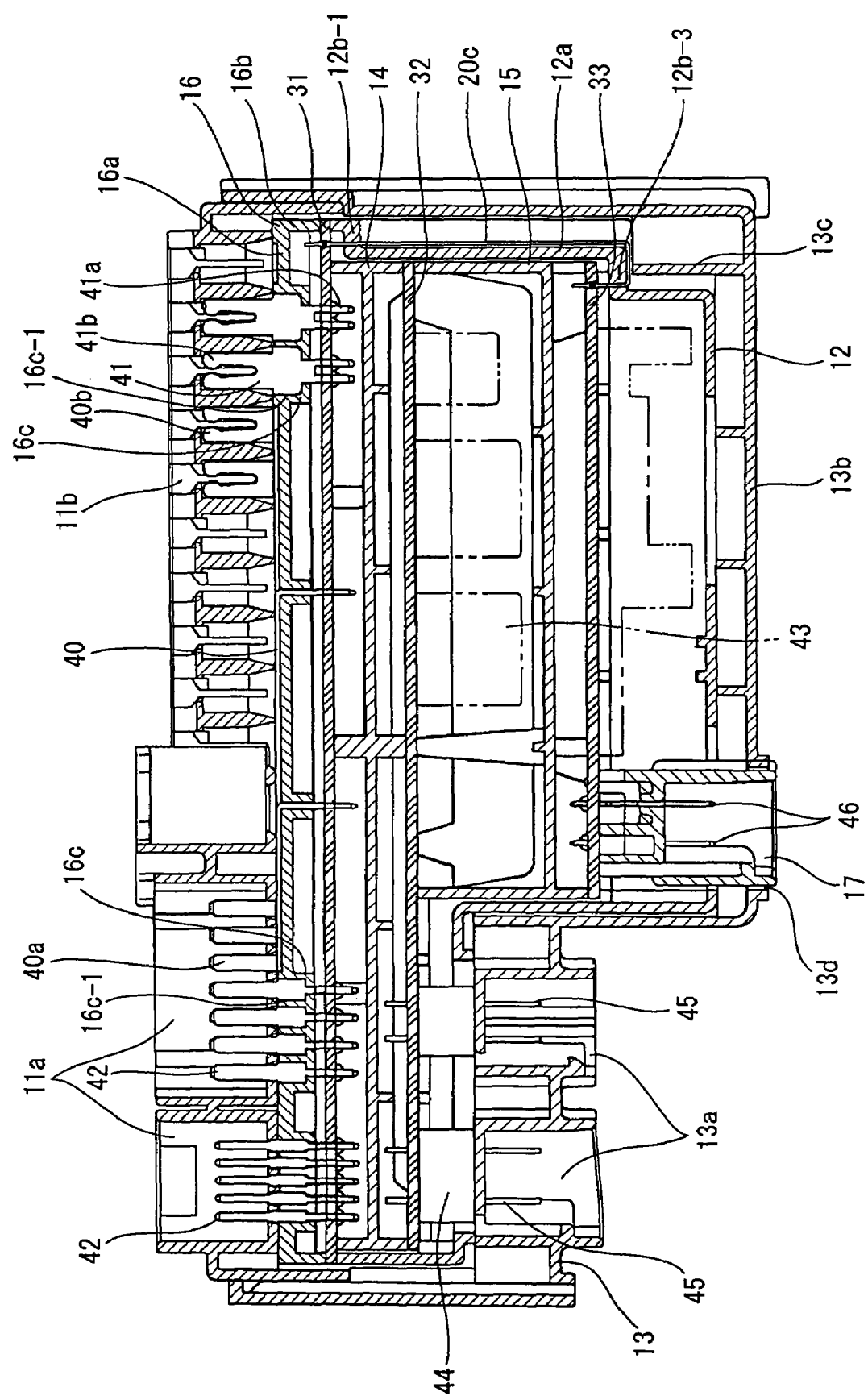
FIG. 3 is a sectional view of the electric junction box taken along a line I2–I2.

As shown in FIG. 1(B), a plurality of connector accommodation parts 13a is provided on a lower surface of the lower case 13. As shown in FIGS. 2 and 3, a supporting part 13c supporting a horizontal stepped part 12b of the printed board holding case 12 are projected from a bottom wall 13b of the lower case 13.

As shown in FIG. 2, in the printed board holding case 12, a peripheral surface is formed stepwise, and a vertical outer surface 12a and a horizontal stepped part 12b are formed alternately in a vertical direction. The horizontal stepped part 12b is projected from a lower end of the vertical outer surface 12a toward the inside of the printed board holding case 12. The vertical outer surface 12a is projected downward from an end of the horizontal stepped part 12b. Thus the width of the printed board holding case 12 becomes gradually smaller toward a lower end thereof. A press fit terminal insertion through-hole 12c through which a first vertical part of the press fit terminal or a second vertical part thereof is inserted is formed on the horizontal stepped part 12b. Peripheral portions of a first printed board 31 through a third printed board 33 are disposed on the horizontal stepped part 12b.

In this embodiment, the printed board holding case 12 accommodates the first through third printed board 31, 32, and 33. In conformity to the number of the printed boards, three horizontal stepped parts 12b-1, 12b-2, and 12b-3 are formed in the printed board holding case 12 from the upper side thereof to the lower side thereof.

As shown in FIG. 2, two intermediate cases are mounted inside the box composed of the upper case 11 and the printed board holding case 12. A first intermediate case 14 and a second intermediate case 15 are constructed of partitioning walls 14a, 15a respectively partitioning the inside of the box into the side of the upper case 11 and the side of the printed board holding case 12 and peripheral walls 14b, 15b projected vertically from peripheries of the partitioning walls 14a, 15a respectively.

Over the first intermediate case 14, the upper-position first printed board 31 fixed to an upper end of the peripheral wall 14b of the first intermediate case 14 is disposed. A peripheral portion of the first printed board 31 is disposed over the horizontal stepped part 12b-1. Disposed between the first intermediate case 14 and the second intermediate case 15 is the intermediately positioned second printed board 32 fixed to a lower end of the peripheral wall 14b of the first intermediate case 14 and to an upper end of the peripheral wall 15b of the second intermediate case 15. A peripheral portion of the second printed board 32 is disposed above the horizontal stepped part 12b-2. Disposed below the second intermediate case 15 is the lower-position third printed board 33 fixed to a lower end of the peripheral wall 15b of the second intermediate case 15. A peripheral portion of the third printed board 33 is disposed above the horizontal stepped part 12b-3.

Figure 4:
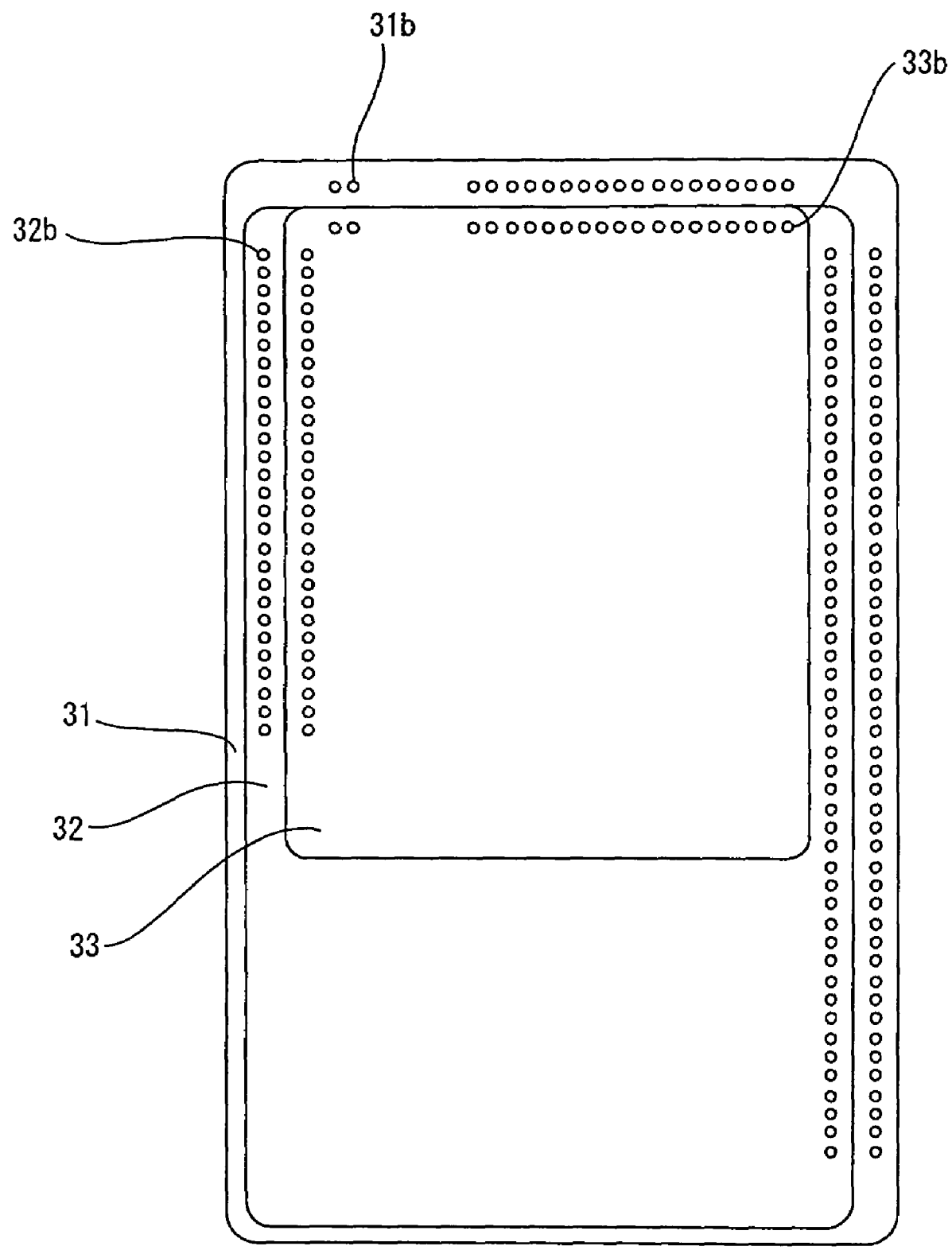
FIG. 4 is a bottom view of first through third printed boars.
Figure 7:
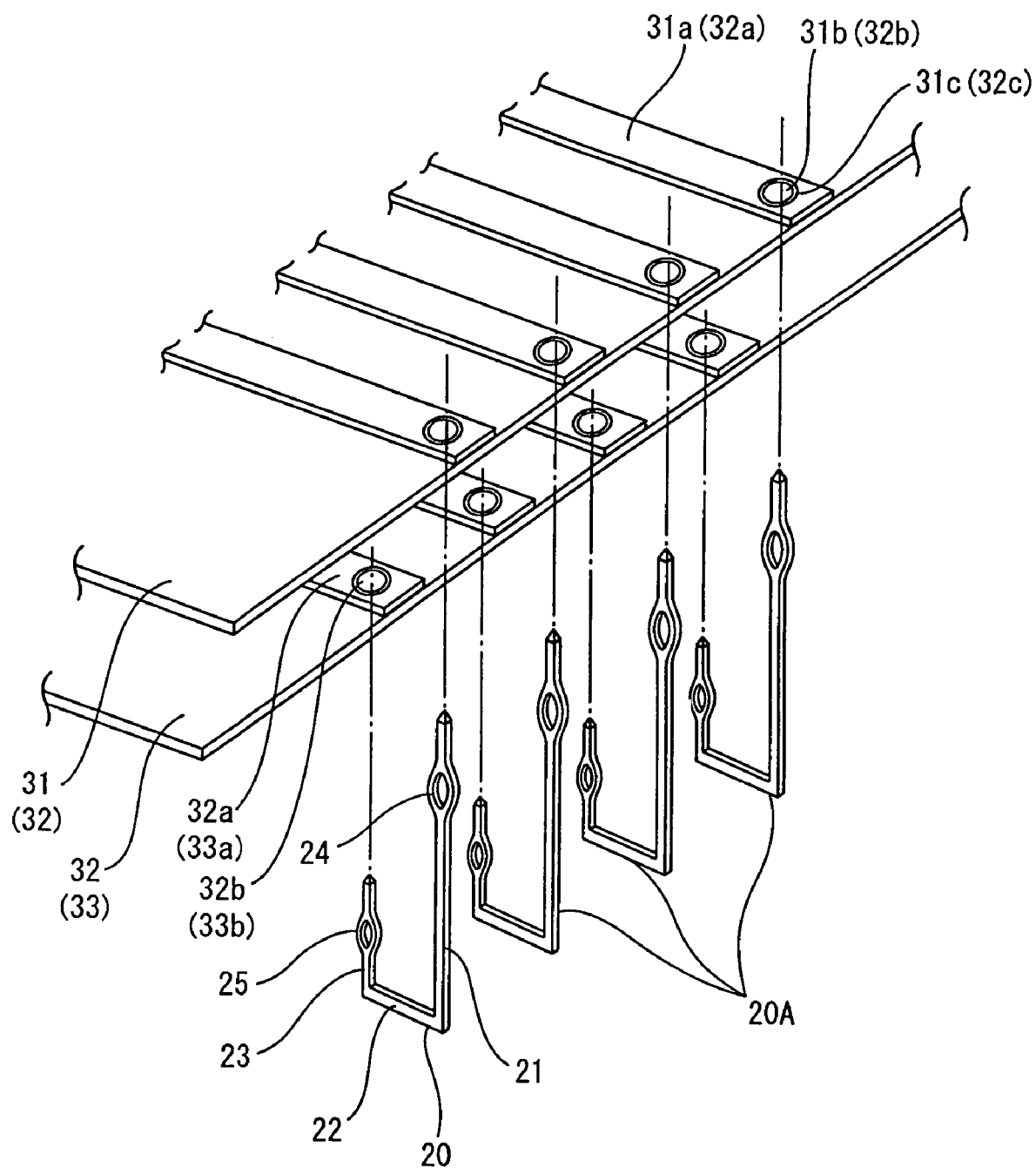
FIG. 7 shows a method of pressing the press fit terminal into printed boards.

As shown in FIG. 4, in the first through third printed boards 31, 32, and 33, the peripheral portion of the upper-position first printed board 31 is projected outward beyond the peripheral portion of the intermediately positioned second printed board 32. Similarly, the peripheral portion of the intermediately positioned second printed board 32 is projected outward beyond the peripheral portion of the lower-position third printed board 33. That is, the sizes of the printed boards are set larger in the order of the first printed board 31, the second printed board 32, and the third printed board 33. As shown in FIG. 7, electric conductors 31a, 32a, and 33a having terminal holes 31b, 32b, and 33b formed therethrough respectively along a peripheral edge thereof are arranged side by side on the first through third printed boards 31, 32, and 33 respectively. In the first through third printed boards 31, 32, and 33, only the terminal holes 31b, 32b, and 33b formed on the peripheral edge of the electric conductors 31a, 32a, and 33a respectively are shown in FIG. 4, but terminal holes and electric conductors formed at an inner side thereof are not shown.

Figure 5:
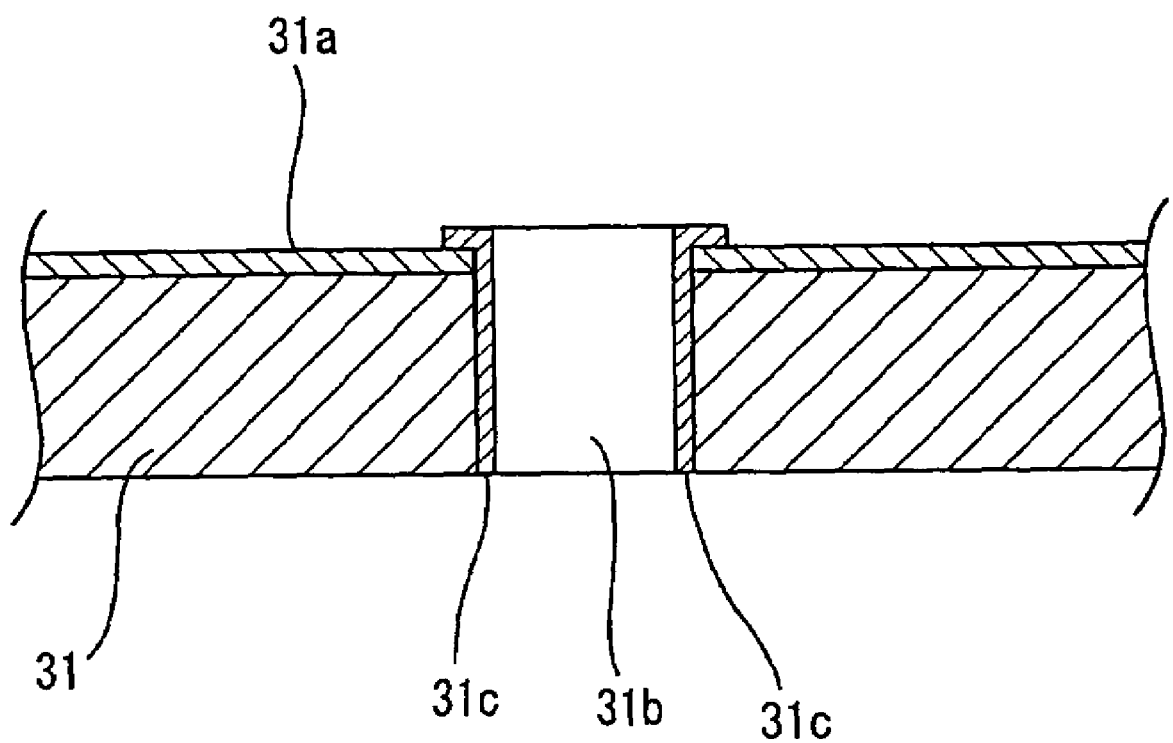
FIG. 5 is a sectional view in which main parts of a terminal hole of a printed board are enlarged.

As shown in FIG. 5, the terminal hole 31b formed on the electric conductor 31a of the first printed board 31 is copper plated on an entire inner peripheral surface of the terminal hole 31a and on the surface of the printed board 31. The copper plated surface of the first printed board 31 is tin plated or solder plated to form a conductive layer 31c. An upper portion of the conductive layer 31c is joined with the electric conductor 31a. The terminal holes 32b and 33b of the second and third printed boards 32 and 33 have a construction respectively similar to that of the terminal hole 31b.

Figure 6:
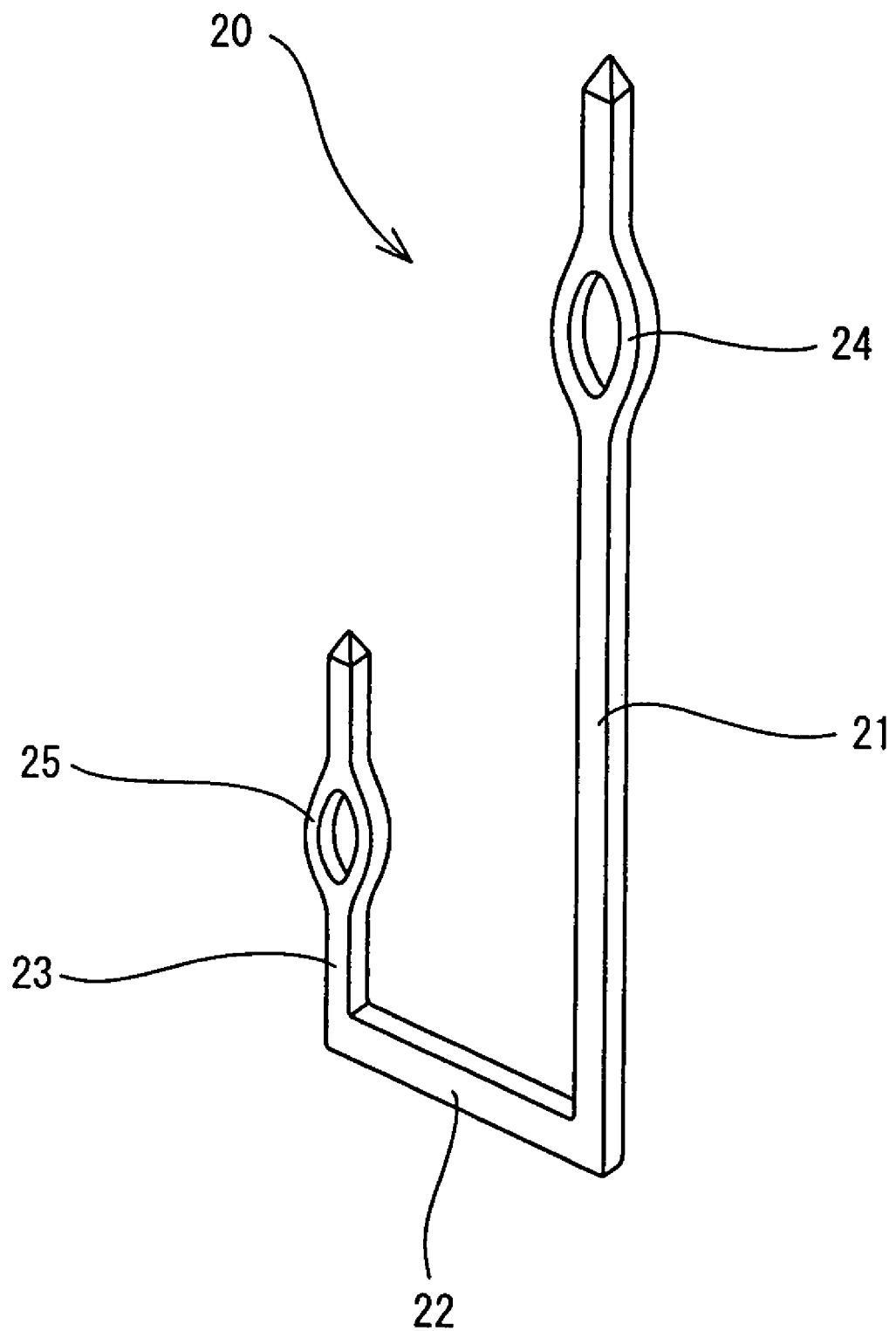
FIG. 6 is a perspective view of a press fit terminal.

As shown in FIG. 6, a press fit terminal 20 connecting the electric conductors of the printed boards to each other is formed by bending a rod-shaped material made of conductive metal. The press fit terminal 20 has a long first vertical part 21, a horizontal part 22 bent at a lower end of the first vertical part 21, and a short second vertical part 23 bent upward at a leading end of the horizontal part 22. Press fit parts (press fit electric contact part) 24, 25 are formed at a leading end of the first vertical part 21 and at a leading end of the second vertical part 23 respectively. The press fit parts 24, 25 are shaped rhombically by striking the center thereof in the widthwise direction thereof to bend right and left side portions thereof outward in the shape of a letter <. The leading end of each of the press fit parts 24, 25 decreases taperingly in the diameter thereof.

The electric conductor 31a of the first printed board 31 and the electric conductor 32a of the second printed board 32 are connected with each other with a press fit terminal 20A. The electric conductor 32a of the second printed board 32 and the electric conductor 33a of the third printed board 33 are connected with each other with a press fit terminal 20B whose first vertical part is longer than the first vertical part of the press fit terminal 20A. The electric conductor 31a of the first printed board 31 and the electric conductor 33a of the third printed board 33 are connected with each other with a press fit terminal 20C whose first vertical part is longer than the first vertical part of the press fit terminal 20B.

As shown in FIG. 7, a plurality of the press fit terminals 20A is arranged side by side along the peripheral portion of the first and second printed boards 31, 32. The press fit terminals 20A are pressed into the terminal holes 31b, 32b from the lower end thereof, with the first vertical part 21 of each press fit terminal 20A disposed outward and the second vertical part 23 thereof disposed inward. In FIG. 7, the printed board holding case 12 interposed between the first printed boards 31, 32 and the press fit terminal 20A is not shown.

As shown with A surrounded with a one-dot chain line in FIG. 2, the electric conductor 31a of the first printed board 31 and the electric conductor 32a of the second printed board 32 are connected to each other by using the press fit terminal 20A. More specifically, the second vertical part of the press fit terminal 20A is inserted through the insertion through-hole 12c of the horizontal stepped part 12b-2, and the press fit portion 25 is brought into contact with the terminal hole 32b disposed on the periphery of the second printed board 32 by press fit. The first vertical part 21 is inserted through the insertion through-hole 12c of the horizontal stepped part 12b-1 along the vertical outer surface to bring the press fit part 24 into contact with the terminal hole 31b disposed on the periphery of the first printed board 31 by press fit. Thereby the electric conductor 31a of the first printed board 31a and the electric conductor 32a of the second printed board 32 are connected with each other.

As shown with B surrounded with a one-dot chain line in FIG. 2, the electric conductor 32a of the second printed board 32 and the electric conductor 33a of the third printed board 33 are connected to each other in a similar method by using the press fit terminal 20B. As shown in FIG. 3, the electric conductor 31a of the first printed board 31 and the electric conductor 33a of the third printed board 33 are connected to each other in a similar method by using the press fit terminal 20C.

By connecting the electric conductors 31a, 32a, and 33a of the first through third printed boards 31, 32, and 33 with each other with the press fit terminals 20 and putting the lower case 13 on the printed board holding case 12, as shown in FIGS. 2 and 3, the horizontal part 22 of the press fit terminal 20 is supported from below by the supporting part 13c projected from the bottom wall 13b of the lower case 13.

As shown in FIG. 2, an insulating sheet 16 disposed above the first printed board 31 is constructed of a partitioning wall 16a partitioning the inside of the box into the side of the upper case 11 and the side of the printed board holding case 12 and a peripheral wall 16b projected vertically from a periphery of the partitioning wall 16a. A lower end of the peripheral wall 16b is in contact with the peripheral edge of the first printed board 31. Bus bars 40 are disposed on an upper surface of the partitioning wall 16a of the insulating sheet 16. Required portions of the bus bars 40 are bent upward to form tabs 40a and pressure contact tabs 40b. The tabs 40a are projected into the connector accommodation parts 11a provided in the upper case 11, and the pressure contact tabs 40b are projected into the fuse accommodation parts 11b to connect them to a connector and fuses (not shown) of an external circuit.

Bifurcated pins 41a formed at lower ends of pressure contact terminals 41 are penetrated through the first printed board 31 and soldered to the electric conductors 31a respectively. Pressure contact blades 41b formed at upper ends of the pressure contact terminals 41 are projected into the fuse accommodation parts 11b provided in the upper case 11.

Lower portions of tab terminals 42 made of conductive metal are penetrated through the terminal holes of the first printed board 31 and soldered to the electric conductors 31a, and upper portions of the tab terminals 42 are projected into the connector accommodation parts 11a and the fuse accommodation parts 11b of the upper case 11 to connect them to the connector and the fuses (not shown) of the external circuit. Middle portions of the pressure contact terminals 41 and those of the tab terminals 42 are formed wider than other portions thereof and locked to through-holes 16c-1 of terminal holding portions 16c projected downwardly from the insulating sheet 16. Thereby the pressure contact terminals 41 and the tab terminals 42 are fixed to the insulating sheet 16 by press fit.

A plurality of electronic parts and terminal holding blocks 44 made of resin are mounted on a lower surface of the second printed board 32. Terminal materials 45 are molded inside the terminal holding blocks 44. One end of a formed terminal projected from an upper surface of each of the terminal holding blocks 44 is penetrated through the second printed board 32 and connected to the electric conductor 32a. The other end of the terminal projected from a lower surface of the terminal holding blocks 44 is projected into the connector accommodation part 13a of the lower case 13 and connected to the connector (not shown) of the external circuit.

Terminals 46 made of conductive metal are fixed to a connector housing 17 for use in a PCB by press fit or insert mold in advance. One end of each of the terminals 46 projected outward from the connector housing 17 is inserted into a through-hole of the third printed board 33 and soldered thereto. The connector housing 17 is fixed to the third printed board 33 by tightening screws, inserted through an opening 13d formed on the lower case 13, and exposed to the outside of the lower case 13. The other end of the terminal 46 projected into the connector housing 17 is connected to the connector (not shown) of the external circuit.

The method of assembling the electric junction box 10 is described below.

Figure 8A:
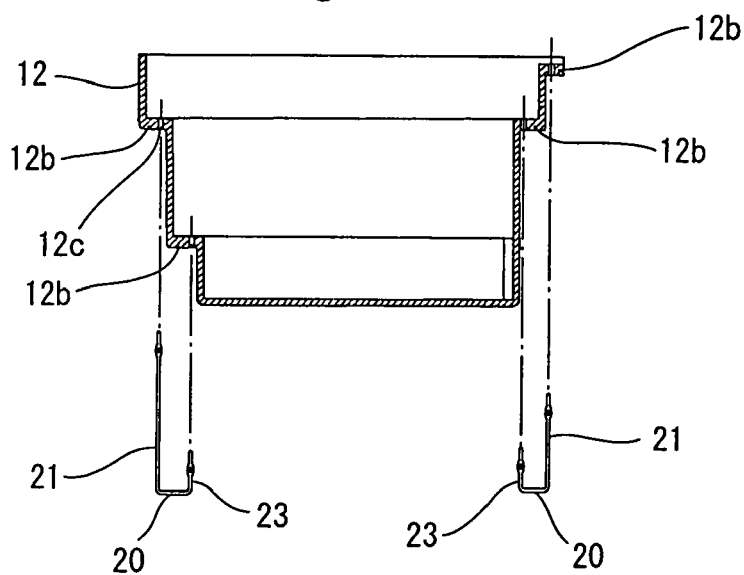
FIGS. 8(A) through 8(C) show a method of connecting electric conductors of the printed boards and the press fit terminals to each other.

Initially, as shown in FIG. 8(A), an upper portion of the second vertical part 23 of the press fit terminal 20 and that of the first vertical part 21 thereof are inserted into the insertion through-hole 12c of the horizontal stepped part 12b.

Figure 8B:
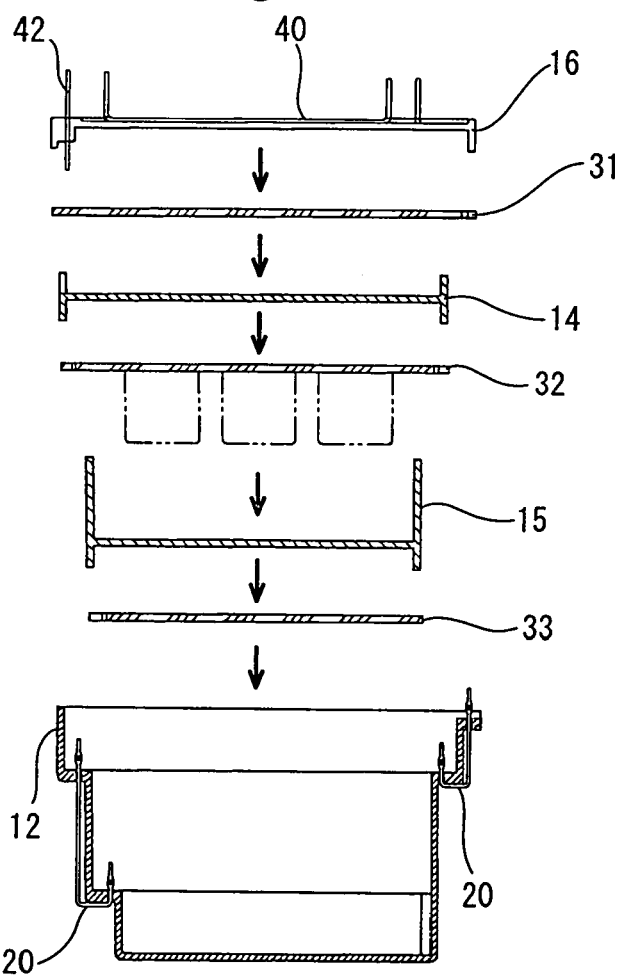
Figure 8C:
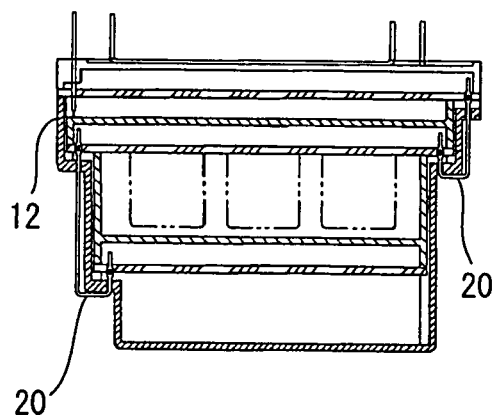

Thereafter as shown in FIGS. 8(B) and 8(C), the first through third printed boards 31, 32, and 33 and the first and second intermediate cases 14, 15 are alternately accommodated in the printed board holding case 12, and the peripheral portions of the first through third printed boards 31, 32, and 33 are supported by the horizontal stepped part 12b of the printed board holding case 12. Further the insulating sheet 16 and the bus bar 40 are disposed above the first printed board 31, and the terminal 42 is connected to the first printed board 31. At this time, the press fit portion 25 of the second vertical part 23 of each press fit terminal 20 is pressed into the terminal hole of the lower-position printed board, and the press fit portion 24 of the first vertical part 21 is pressed into the terminal hole of the upper-position printed board. Thereby the electric conductors of the printed boards disposed are connected to each other with the press fit terminals 20.

Figure 9A:
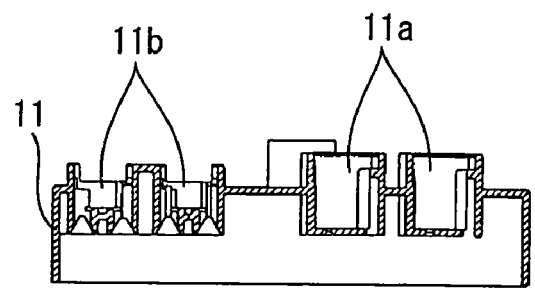
FIGS. 9(A) and 9(B) show a method of assembling the electric junction box.
Figure 9A:
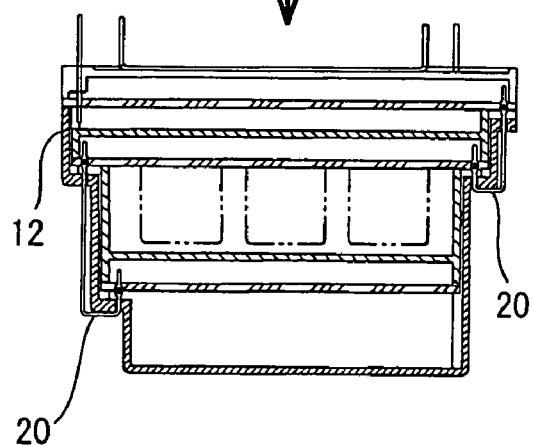
Figure 9B:
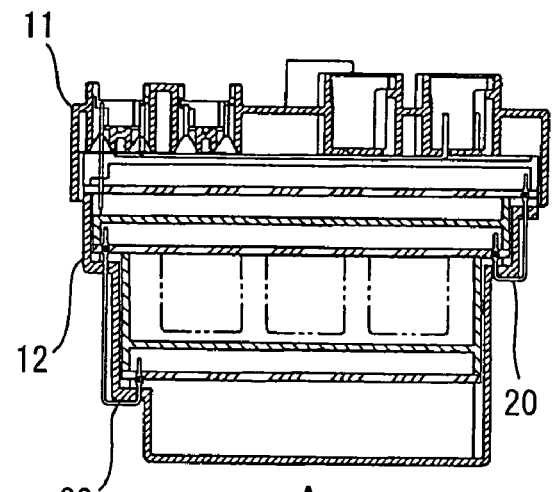
Figure 9B:
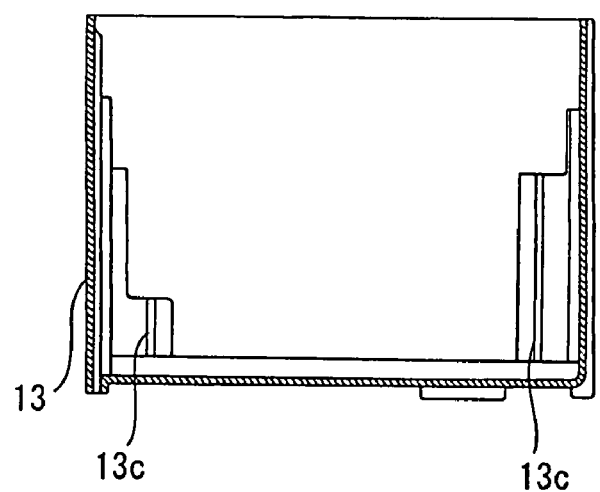

Thereafter as shown in FIG. 9(A), the upper case 11 in which the connector accommodation part 11a and the fuse accommodation part 11b have been formed is placed on the printed board holding case 12 and joined therewith. Thereafter as shown in FIG. 9(B), the lower case 13 is placed on the printed board holding case 12 and joined with the upper case 11. At this time, the press fit terminals 20 connected with the electric conductor of the printed board are supported at the lower side thereof by the supporting part 13c formed on the lower case 13.

In the above-described construction, the horizontal part 22 of the press fit terminal 20 disposed at the lower end thereof is supported by the supporting part 13c projected from the bottom wall 13b of the lower case 13. Therefore by merely pressing the press fit terminals 20 into the terminal holes 31b, 32b, and 33b of the first through third printed boards 31, 32, and 33, the electric conductors 31a, 32a, and 33a of the first through third printed boards 31, 32, and 33 can be connected to each other. Thereby it is unnecessary to solder the first through third printed boards 31, 32, and 33 and the press fit terminals 20 to each other and possible to facilitate the above-described connection work.

Because the peripheral portion of the upper-position printed board is projected beyond the peripheral portion of the lower-position printed board, and the terminal holes are formed on the projected portion, the first vertical part 21 of the press fit terminal 20 connected with the electric conductor of the upper-position printed board and the lower-position printed board do not interfere with each other. Thereby it is unnecessary to form a through-hole for inserting the first vertical part therethrough on the lower-position printed board. Further only the press fit portions 24, 25 of the first vertical part 21 and the second vertical part 23 are pressed into the terminal holes of the printed board. Therefore it is possible to facilitate the connection of the press fit terminal 20 to the printed boards. Further in the state where the horizontal part 22 of the press fit terminal 20 is disposed along the lower surface of the horizontal stepped part 12b of the printed board holding case 12 and in the state where the first vertical part 21 is disposed along the vertical outer surface 12a of the stepwise part of the printed board holding case 12, the first vertical part 21 is pressed into the terminal hole of the upper-position printed board, and the second vertical part 23 is pressed into the terminal hole of the lower-position printed board. Therefore the press fit terminal 20 can be fixed to the printed board in a stable state.

Further because it is easy to connect the electric conductors of the printed boards to each other, the electric junction box 10 can be assembled easily and a plurality of the printed boards can be accommodated inside the electric junction box. Thus the electric junction box is allowed to have a high density, be compact, and have a low cost.

Figure 10:
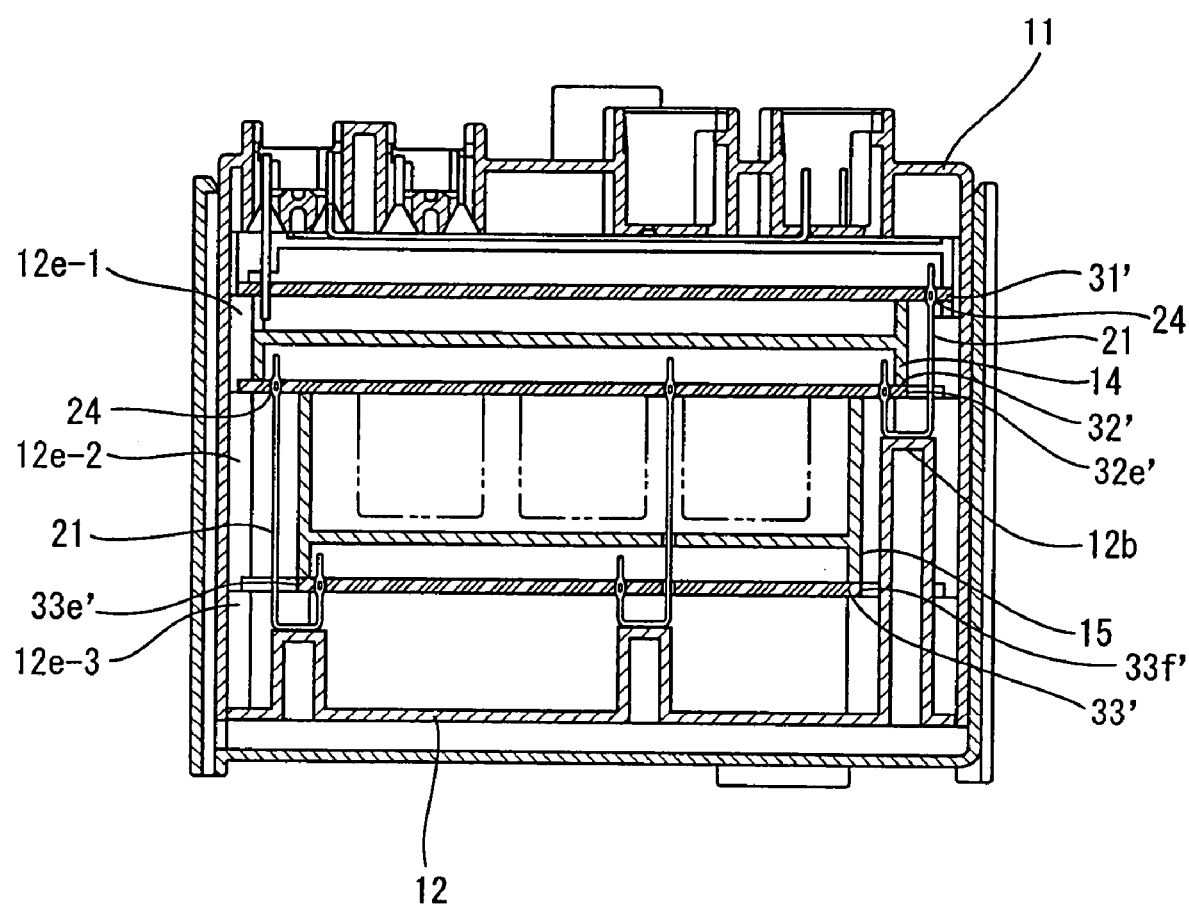
FIG. 10 is a sectional view of an electric junction box of a modification of an embodiment.
Figure 11:
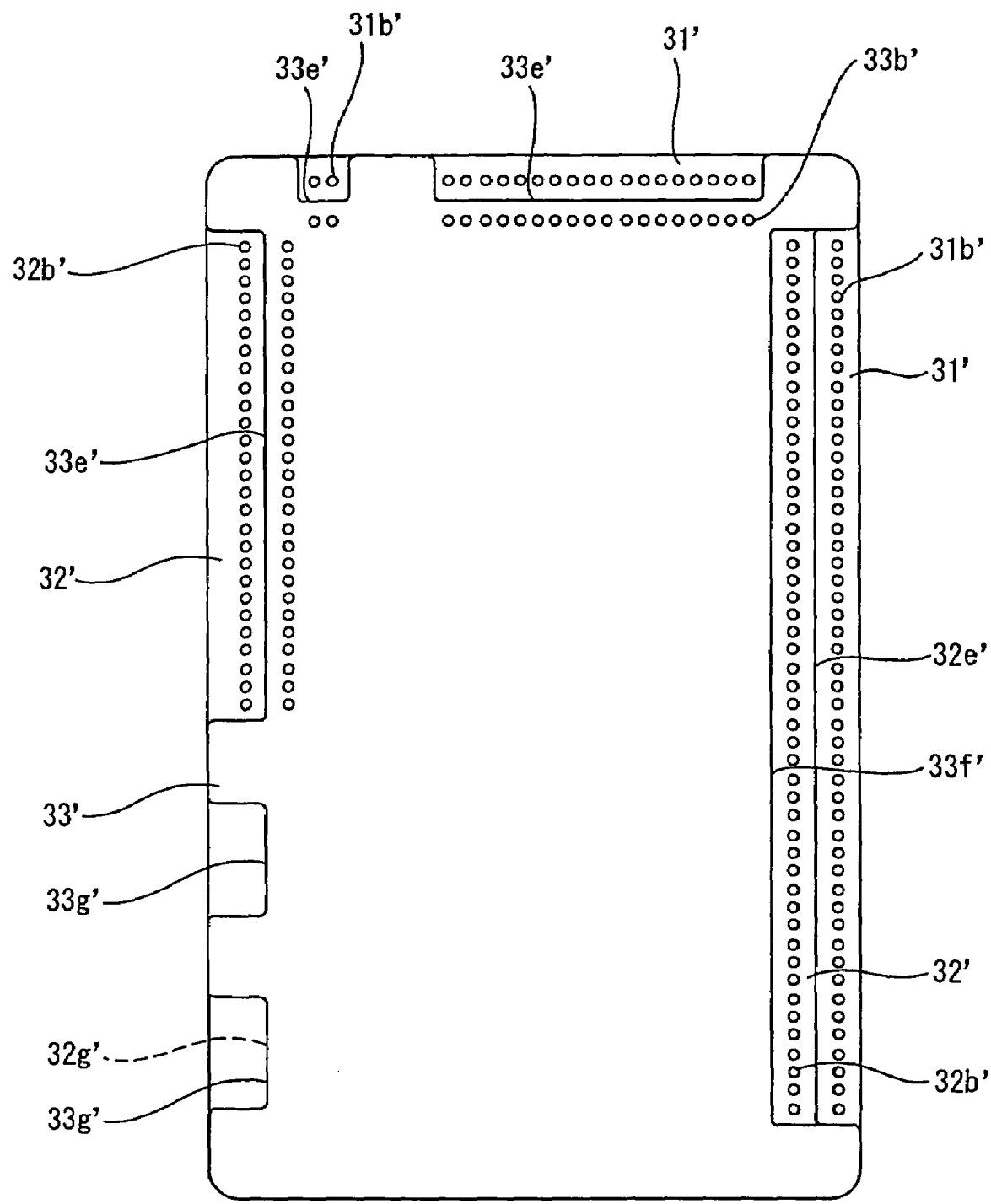
FIG. 11 is a bottom view showing a state in which first through third printed boards of the modification of the embodiment are disposed.
Figure 12A:
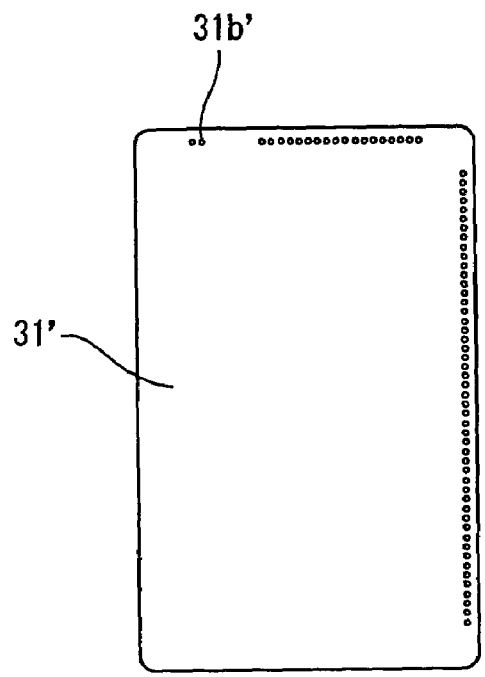
FIG. 12 shows the printed boards of the modification of the embodiment, in which (A) is a bottom view of the first printed board, (B) is a bottom view of the second printed board, and (C) is a bottom view of the third printed board.
Figure 12B:
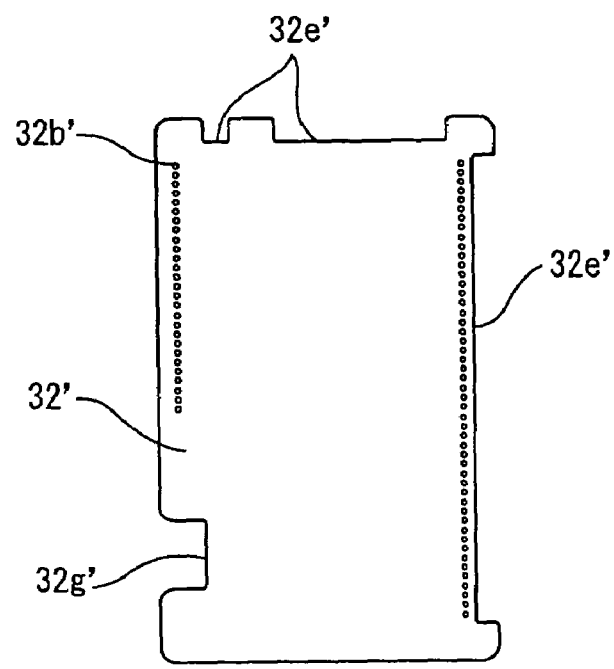
Figure 12C:
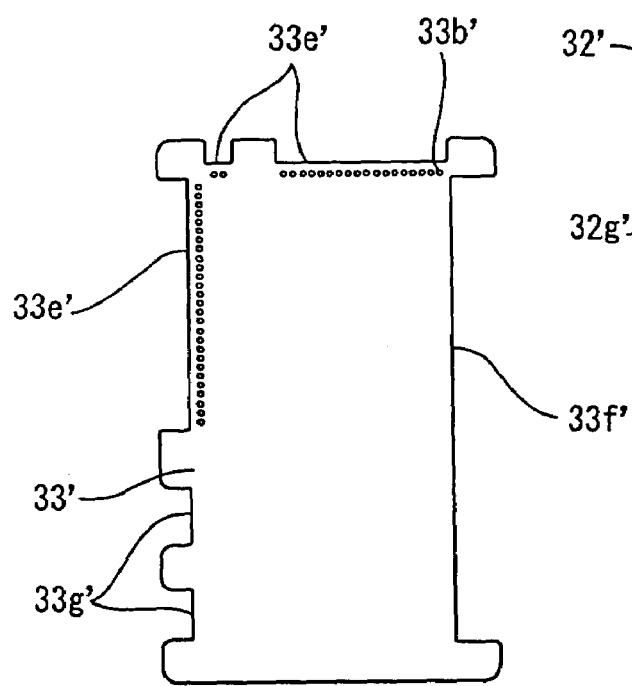
Figure 13:
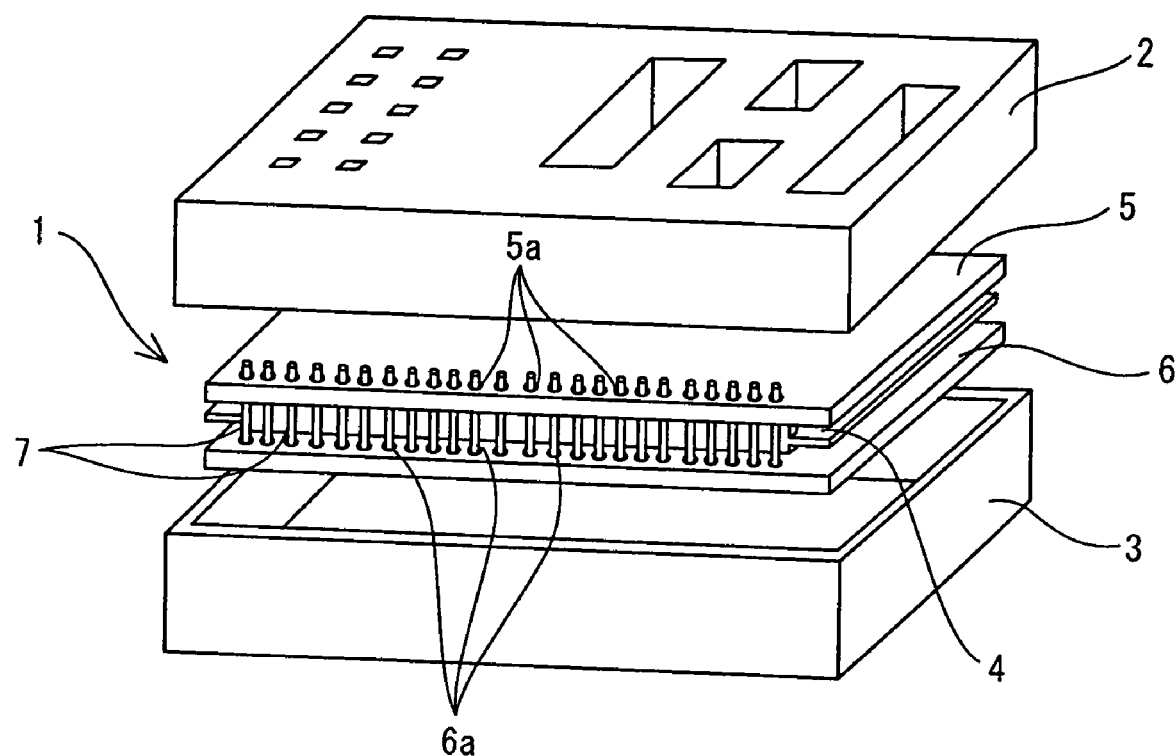
FIG. 13 shows an example of a conventional art.

FIGS. 10 through 12 show a modification of the above-described embodiment in which first through third printed boards 31', 32', and 33' accommodated inside a box composed of the upper case 11 and the printed board holding case 12 have the same size.

As shown in FIGS. 11 and 12, terminal holes 31b', 32b', and 33b' are formed on the first through third printed boards 31', 32', and 33' at the same positions as the positions where the terminal holes 31b, 32b, and 33b are formed on the first through third printed boards 31, 32, and 33 of the above-described embodiment. Cut-off portions 32e' and 33e' for terminal through which the first vertical part 21 of the press fit terminal 20 are formed on the second and third printed boards 32' and 33' respectively. Formed on the third printed board 33' is a cut-off portion 33f' through which a stepwise part 12b supporting from below a lower side of the press fit terminal 20 connecting the first printed board 31' and the second printed board 32' to each other is inserted.

In this modification, a peripheral wall of the printed board holding case is formed not stepwise, but instead supporting ribs 12e-1 through 12e-3 supporting the first through third printed boards 31', 32', and 33' respectively at a lower side thereof are projectingly formed along the peripheral wall of the printed board holding case. Therefore cut-off portions 32g', 33g' through which the supporting ribs 12e-1, 12e-2 respectively are inserted are formed on the second and third printed boards 32' and 33'.

By mounting the first through third printed boards 31', 32', and 33' on the first and second intermediate cases 14, 15, the first through third printed boards 31', 32', and 33' are connected to each other with the press fit terminals 20. When the first through third printed boards 31', 32', and 33' connected to each other are accommodated inside the box, as shown in FIG. 10, the first vertical part 21 of the press fit terminal 20 passes through the cut-off portions 32e', 33e' of the second and third printed boards 32', 33', and the stepwise part 12b passes through the cut-off portion 33f of the third printed board 33' and supports the press fit terminal 20 from below. Further the supporting ribs 12e-1, 12e-2 pass through the cut-off portions 32g', 33g' of the second and third printed boards 32' and 33' respectively, and the supporting ribs 12e-1 through 12e-3 support the first through third printed boards 31', 32', and 33' from below.

The invention claimed is:

1. An electric junction box in which a plurality of printed boards stepwise disposed is accommodated inside an upper case and a printed board holding case, with said printed boards spaced at intervals; a periphery of an upper-position printed board is projected beyond a periphery of a lower-position printed board; electric conductors are arranged side by side on a peripheral portion projected from said lower-position printed board; and terminal holes each having a conductive layer, connected with one of said electric conductors, formed on an inner peripheral surface thereof are arranged side by side on said peripheral portion projected from said lower-position printed board, a peripheral wall of said printed board holding case is formed stepwise in conformity to a stepwise disposition of a plurality of said printed boards; and insertion through-holes through which press fit terminals are inserted respectively are formed side by side on each horizontal stepped part;

each of said press fit terminals is formed by bending a rod-shaped material made of conductive metal and has a long first vertical part, a horizontal part bent at a lower end of said first vertical part, and a short second vertical part bent upward at a leading end of said horizontal part; and a plurality of said press fit terminals is disposed along said peripheries of said printed boards; said horizontal parts of said press fit terminals are disposed along a lower surface of each of said horizontal stepped parts of said printed board holding case, and said second vertical part of each of said press fit terminals is inserted through an insertion through-hole of each of said horizontal stepped parts and pressed into each of said terminal holes of said lower-position printed boards to thereby electrically bring said second vertical part into contact with said conductive layer; and said first vertical part of each of said press fit terminals is disposed along a vertical outer surface of a stepwise part of said printed board holding case, and an upper portion of said first vertical part is pressed into one of said terminal holes of said upper-position printed board to thereby electrically bring said first vertical part into contact with said conductive layer.

2. The electric junction box according to claim 1, wherein the number of said printed boards is two or more; and electric conductors of adjacent upper and lower printed boards or electric conductors of upper and lower printed boards sandwiching an intermediately positioned printed board therebetween are connected to each other with said press fit terminals.

3. The electric junction box according to claim 1, wherein a lower case is placed on said printed board holding case in such a way that the lower case covers the printed board holding case; a supporting part supporting a horizontal stepped part of said printed board holding case from below is projected from said lower case; and said supporting part supports a horizontal part of said press fit terminal disposed along a lower surface of said horizontal stepped part.

4. The method of assembling an electric junction box according to claim 3, comprising the steps of inserting a second vertical part of a press fit terminal into an insertion through-hole of a lower-position horizontal stepped part of a printed board holding case from a periphery of said printed board holding case; inserting a first vertical part of said press fit terminal into an insertion through-hole of an upper-position horizontal stepped part of said printed board holding case; accommodating a plurality of said printed boards inside said printed board holding case by supporting peripheral portions of said printed boards with said horizontal stepped parts of said printed board holding case; pressing said second vertical part of said press fit terminal into a terminal hole of a lower-position printed board; pressing an upper portion of said first vertical part into a terminal hole of an upper-position printed board; connecting electric conductors of said printed boards disposed by said press fit terminal; thereafter placing an upper case in which connector accommodation parts, fuse accommodation parts or/and relay accommodation parts are formed on said printed board holding case and connecting said upper case to said printed board holding case; and placing a lower case on said printed board holding case and connecting said lower case to said upper case.

5. The electric junction box according to claim 2, wherein a lower case is placed on said printed board holding case in such a way that the lower case covers the printed board holding case; a supporting part supporting a horizontal stepped part of said printed board holding case from below is projected from said lower case; and said supporting part supports a horizontal part of said press fit terminal disposed along a lower surface of said horizontal stepped part.

6. The method of assembling an electric junction box according to claim 5, comprising the steps of inserting a second vertical part of a press fit terminal into an insertion through-hole of a lower-position horizontal stepped part of a printed board holding case from a periphery of said printed board holding case; inserting a first vertical part of said press fit terminal into an insertion through-hole of an upper-position horizontal stepped part of said printed board holding case; accommodating a plurality of said printed boards inside said printed board holding case by supporting peripheral portions of said printed boards with said horizontal stepped parts of said printed board holding case; pressing said second vertical part of said press fit terminal into a terminal hole of a lower-position printed board; pressing an upper portion of said first vertical part into a terminal hole of an upper-position printed board; connecting electric conductors of said printed boards disposed by said press fit terminal; thereafter placing an upper case in which connector accommodation parts, fuse accommodation parts or/and relay accommodation parts are formed on said printed board holding case and connecting said upper case to said printed board holding case; and placing a lower case on said printed board holding case and connecting said lower case to said upper case.

* * * * *